May 17, 1966 J. MARINO ETAL 3,252,060

VARIABLE COMPRESSION CONTACTED SEMICONDUCTOR DEVICES

Filed Oct. 23, 1962

WITNESSES

INVENTORS
John T. Krawczykiewicz, Thomas P. Nowalk
Joseph Marino
BY
ATTORNEY

United States Patent Office 3,252,060

Patented May 17, 1966

3,252,060
VARIABLE COMPRESSION CONTACTED SEMICONDUCTOR DEVICES

Joseph Marino, Irwin, John T. Krawczykiewicz, Pittsburgh, and Thomas P. Nowalk, Irwin, Pa., assignors to Westinghouse Electric Corporation, Pittsburgh, Pa., a corporation of Pennsylvania Filed Oct. 23, 1962, Ser. No. 232,546
6 Claims. (Cl. 317—234)

The present invention is concerned with improvements in or relating to sealed electrical devices.

In known methods of fabricating sealed electrical devices comprising an electrode support member mounting semiconductor elements, the elements were joined to the support member by hard or soft-solders. Semiconductor devices fabricated by employing soft solders are characterized by relatively short operating lifetimes owing to thermal fatigue of the soft-solder joints. Devices fabricated employing hard solders usually require relatively high processing temperatures which may be ultimately deleterious to the semiconductor element proper.

Therefore, an object of the present invention is to provide a semiconductor device comprising an electrode support mounting a semiconductor element and a header enclosing the element in which good electrical contact between the element and the support is maintained solely by means of adjustable pressure means.

A further object of the invention is to provide a hermetically sealed semiconductor device wherein a semiconductor element is resiliently urged by spring means into good electrical and thermal contact with an electrode support and adjustable means affixed to the support member are provided within the hermetic casing to vary the spring pressure.

Another object of the present invention is to provide a reliable hermetically sealed semiconductor device comprising an electrode support of a good thermally and electrically conductive metal, a semiconductor element disposed on the upper surface of the support, a threaded cylindrical metal member completely enveloping the element and joined to the support, at least one spring member disposed on the semiconductor element, a threaded screw member disposed within and cooperating with the cylindrical member to provide a desired pressure on the spring members thereby exerting pressure on the semiconductor element to provide good electrical contact between the element and the upper surface of the support without the use of a solder and a header completely enclosing the element and joined to the support..

Other objects of the invention will, in part, be obvious and will, in part, appear hereinafter.

In order to more fully understand the nature and objects of the invention reference should be had to the following detailed description and drawings, in which.

Figure 1:
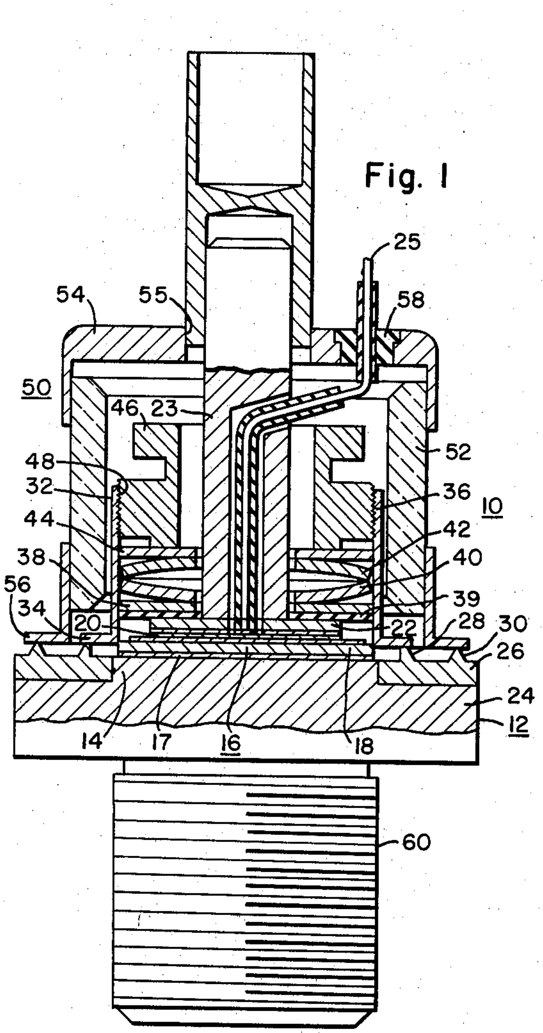
FIG. 1 is a vertical section of a sealed electrical device.

In accordance with the present invention and in attainment of the foregoing objects, there is provided a sealed electrical device comprising a good thermally and electrically conductive support having an upper surface, a semiconductor element disposed on the upper surface of the support, at least one electrical lead disposed in the semiconductor element, adjustable compressive spring means acting on the semiconductor element to provide a predetermined good electrical contact between the electrical lead and the element and between the element and the support, and a header joined to the support to provide a hermetic enclosure for the element.

More particularly, there is provided a hermetically sealed semiconductor device having a thermally conductive support member of a metal selected from the group consisting of copper, copper base alloys, silver, silver base alloys, aluminum and aluminum base alloys and ferrous base alloys. The support member comprises a peripheral flange and a flat surfaced mounting portion centrally located on which a contact assembly comprising a semiconductor element and at least one cathode and anode contact may be disposed in a stacked arrangement. The surfaces of the element and contacts closely conform so as to enable good thermal and electrical contact therewith. A metal cylindrical member, preferably of a ferrous or aluminum base, having a laterally extending flange at the lower end and a threaded segment on the inner periphery at the upper end is joined to the periphery of the upper surface of the support at the flange so as to completely envelope the flat surfaced mounting portion. The semiconductor element is joined to an electrode contact member of a good electrical and thermal conductor such as molybdenum, tungsten, tantalum or base alloys thereof, and is disposed on the upper surface of the support within the cylindrical member. One or more electrical conductors may be joined to a counterelectrode contact member of the semiconductor element prior to the assembly of the device in order to conduct current to the device from exterior sources. A plurality of spring members, such as spring washers are disposed on the upper surface of the counterelectrode contact member of the semiconductor element. An apertured externally threaded sleeve member of, for example, a ferrous base metal, is disposed around the electrical conductors within the cylindrical member. The threaded sleeve member is threadedly engaged so that after an external pressure is applied to the spring members the screw member may be set to cooperate with the inner threads of the cylindrical member to maintain a constant pressure on the contact assembly to provide good electrical contact between the cathode contact and the semiconductor element and between the anode contact and the upper surface of the support. Thereafter, a header member having a laterally extending flange and an insulating segment is welded to the outer periphery of the upper surface of the flange of the semiconductor element.

Referring to FIG. 1, a sealed electrical device 10 according to the invention comprises an electrical contact heat dissipating support member 12 of a metal selected from the group consisting of copper, copper base alloys, silver, silver base alloys, aluminum and aluminum base alloys and ferrous base alloys. Copper and brass have been found particularly satisfactory for this purpose. The support member 12 comprises a centrally disposed flat surfaced mounting portion 14 on which a contact assembly 16 comprising an electrode contact 18, a semiconductor element 20, a cathode contact 22, may be disposed so that electrical current may be conducted thereto and heat may be dissipated to the support member. The mounting portion 14 is circumscribed by a peripheral flange 24, the upper surface of the flange having a metal ring 26 joined to its upper periphery, the ring having two circular projections 28 and 30.

Figure 2:
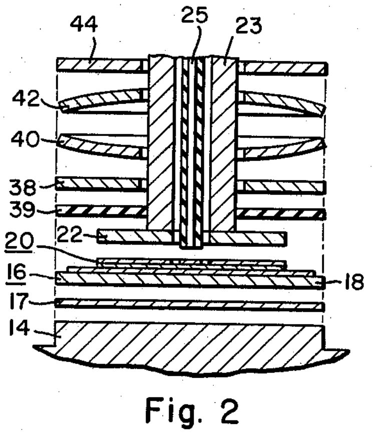
FIG. 2 is an enlarged fragmentary exploded sectional view showing the details of the center portion of FIG. 1 adjacent to the cylindrical metal member.

As shown in more detail in the exploded view in FIG. 2, the anode contact 18, comprising a metal, such as molybdenum or tungsten or base alloys thereof, provides a firm supporting structure for a semiconductor element 20 with substantially similar thermal expansion characteristics along with good electrical and thermal conductivity. The anode contact 18 may be separated from the mounting portion 14 by a non-reactive, malleable, electrically and thermally conductive metal layer 17, such as, gold or silver to compensate for surface irregularities. The semiconductor element 20 may be and preferably is joined to the anode contact 18 in a prior joining operation. The cathode contact 22 may comprise a metal, such as molybdenum and has joined thereto electrical conductors 23 and 25 electrically insulated from each other. The dual conductors 23 and 25 employed are required in devices such as controlled rectifiers. However, it should be understood that in simple diode rectifiers, only one conductor such as 23 is necessary. It is important that the surfaces between contact 18 and layer 17 as well as the surfaces between cathode contact 22 and the semiconductor element 20 be closely similar—i.e., be flat and planar so that no uneven pressures develop when compressed. The malleable layer 17 will compensate for any minor surface irregularities.

A ferrous base metal cylindrical sleeve member 32 having a laterally extending flange 34 at the lower end and a threaded segment 36 on the inner periphery of the upper end is welded at the flange 34 to the circular projection 28 on the ring member 26. Disposed within the sleeve member are the contact assembly 16 comprising contacts 18 and 22 and the semiconductor element 20 disposed on the mounting portions 14, with a flat metal washer 38 resting on an insulating washer 39 of ceramic or mica, and spring washers 40 and 42, followed by another flat washer 44 all stacked on the contact assembly 16 and circumscribe conductors 23 and 25 within the cylindrical member 32. An apertured threaded member 46 is disposed around the conductor 23 within the cylindrical member 32, the screw member 46 having threads 48 located on the outer surface thereof. A means of exerting pressure is positioned within the aperture in the screw member 46 and around connections 23 and 25 and a predetermined pressure is applied to the upper washer 44. The threads 48 on the screw member are then engaged with the inner threads 36 of the cylindrical member 32 to maintain the predetermined substantially constant pressure by coaction with the spring washers 40 and 42 on the contact assembly 16 to provide good electrical contact between the semiconductor element 20 and the cathode contact 22 and between the anode contact 18 and the mounting portion 14 of the support 12. The external pressure means may then be released. A hydraulic press or other means may be employed to provide a selected pressure on the semiconductor element and the contacts. Pressure of the order of from 1000 lbs. to 2000 lbs. may be applied. A pressure of 1500 lbs. has been found to be particularly satisfactory.

A header member 50 comprising a ceramic sleeve 52 with a cap member 54 joined to the outer upper end and a ferrous base metal sleeve having a laterally extending flange 56 joined to the outer end is welded to the circular projection 30 on the ring member 26. The cap 54 comprises an insulating segment 58 with the electrical conductor 25 passing therethrough. The electrical conductor 23 passes through a centrally located aperture 55 in the cap 54.

On the opposite surface of the support member 12 may be attached an electrical conductor and thermal dissipating stud 60 to connect the support to an electrical conductor and heat sink. As shown in FIG. 1, the stud portion is threaded to provide a convenient means for attachment. Other means of attachment will be apparent to those skilled in the art.

It should be understood that the ferrous base metal flanges 34 and 56 may be welded directly to the flange 24 of the support 12 or they may be welded to the support in the manner set forth in Patent 3,005,867.

Furthermore, it should be understood that the header 50 indicated in FIG. 1 is of typical construction but in no way limits the invention. Other headers such as those disclosed in Patent 3,005,867 and patent application Serial No. 185,765, abandoned, may also be employed.

The adjustable threaded sleeve is precisely and easily set such that it enables the semiconductor device to be assembled with a predetermined pressure with respect to the support. Since the contacts 22 and 18 are not soldered to their mating underlying surfaces, there are no forces developed by reason of unequal temperatures during operation which impose bowing or warping stresses on the semiconductor element. Consequently, the semiconductor wafer will not crack or break.

Since certain changes in the product embodying the invention may be made without departing from its scope, it is intended that the accompanying description and drawings be interpreted as illustrative and not limiting.

We claim as our invention:

1. A sealed electrical device comprising a good thermally and electrically conductive support having an upper surface, a semiconductor element disposed on the upper surface of the support, at least one electrical lead disposed on the semiconductor element, adjustable compressive means disposed on the element to provide good electrical contact between the electrical lead and the element and between the element and the support, and a header member separate from the adjustable compressive means and enclosing the adjustable compressive means, said header member joined to the support to provide a hermetic enclosure for the semiconductor element.

2. A sealed electrical device comprising a good thermally conductive support having a peripheral flange having an upper surface; a cylindrical metal member having a laterally extending flange at the lower end thereof and a threaded segment on the inner periphery of the upper end joined to the upper surface of the support at the flange; a semiconductor element disposed on the upper surface of the support within the cylindrical member; at least one electrical conductor disposed on the semiconductor element; an apertured threaded screw member disposed around the electrical conductor within the cylindrical member; the threads being located on the outer surface of the screw to cooperate with the inner threads of the cylindrical member to provide a constant pressure on the spring members thereby exerting pressure on the semiconductor element to provide good electrical contact between the electrical conductor and the element and between the element and the upper surface of the support; and a header member containing an insulating segment with the electrical conductor passing therethrough joined to the outer periphery of the upper surface of the support to provide a hermetic enclosure for the element.

3. A sealed electrical device comprising a good thermally conductive support having a peripheral flange having an upper surface; a ferrous base metal cylindrical member having a laterally extending flange at the lower end thereof and a threaded segment on the inner periphery of the upper end welded to the upper surface of the support at the flange; a contact assembly comprising a semiconductor element and at least one cathode and anode contact disposed on the upper surface of the support within the cylindrical member; at least one electrical conductor joined to the cathode contact; a plurality of spring washers disposed on the cathode contact around the electrical conductor; an apertured threaded screw member disposed around the electrical conductor within the cylindrical member, the threads being located on the outer surface of the screw to cooperate with the inner threads of the cylindrical member to provide a constant pressure on the spring washers thereby exerting pressure on the contact assembly to provide good electrical contact between the cathode contact and the semiconductor element and between the anode contact and the upper surface of the support; a header member containing an insulating segment with the electrical conductor passing therethrough and having a laterally extending ferrous base metal flange welded to the outer periphery of the upper surface of the support to provide a hermetic enclosure for the contact assembly; and, a stud extending from the opposite surface of the support for mounting the support on a heat sink.

4. A sealed electrical device comprising a good thermally conductive support having a peripheral flange having an upper surface; a ferrous base metal ring member hermetically mounted on the upper surface of the peripheral flange of the support; a ferrous base metal cylindrical member having a laterally extending flange at the lower end thereof and a threaded segment on the inner periphery of the upper end welded to the ring member on the upper surface of the support at the flange; a contact assembly comprising a semiconductor element and at least one cathode and anode contact disposed on the upper surface of the support within the cylindrical member; at least one electrical conductor joined to the cathode contact; a plurality of spring washers disposed on the cathode contact around the electrical conductor; an apertured threaded screw member disposed around the electrical conductor within the cylindrical member, the threads being located on the outer surface of the cylindrical member to provide a constant pressure on the spring washers thereby exerting pressure on the contact assembly to provide good electrical contact between the anode contact and the upper surface of the support, a header member containing an insulating segment with the electrical conductor passing therethrough and having a laterally extending ferrous base metal flange adapted to fit against the ring member, a flange being welded to the ring member to provide a hermetic enclosure for the contact assembly; and, a stud extending from the opposite surface of the support for mounting the support on a heat sink.

5. A sealed electrical device comprising a good thermally conductive support having a peripheral flange having an upper surface, the support comprising a metal selected from the group consisting of copper, copper base alloys, silver, silver base alloys, aluminum and aluminum base alloys and ferrous base alloys; a ferrous base metal ring member hermetically mounted on the upper surface of the peripheral flange of the support, the ring member having two narrow circular projections extending above the upper surface of said member, a ferrous base metal cylindrical member having a laterally extending flange at the lower end thereof and a threaded segment on the inner periphery of the upper end welded to the innermost circular projection on the upper surface of the ring member at the flange; a contact assembly comprising a semiconductor element and at least one cathode and anode contact disposed on the upper surface of the support within the cylindrical member, the coefficient of expansion of the contacts and the semiconductor element being closely similar; electrical conductors joined to the cathode contact; a plurality of ferrous base metal spring washers disposed on the cathode contact around the outer periphery of the electrical conductors; an apertured threaded ferrous base metal screw member disposed around the outer periphery of the electrical conductor within the cylindrical member, the threads being disposed on the outer surface of the screw to cooperate with the inner threads of the cylindrical member to provide a constant pressure on the spring washers thereby exerting pressure on the contact assembly to provide good electrical contact between the cathode contact and the semiconductor element and between the anode contact and the upper surface of the support; a header member containing an insulating segment with the electrical conductor passing therethrough and having a laterally extending ferrous base metal flange to fit against the outermost circular projection on the ring member, the flange being welded to the projection to provide a hermetic enclosure for the contact assembly; and, a stud extending from the opposite surface of the support for mounting the support on a heat sink.

6. In a semiconductor device comprising a wafer of semiconductor material and contact members disposed on both surfaces thereon, an electrically conducting, heat dissipating support on which one of the contact members is disposed, resilient means applied to the other contact member and precisely and readily adjustable means including a member having an aperture extending to the exterior and enabling force applying means to contact the resilient means, for applying and maintaining a predetermined pressure on the resilient means whereby the semiconductor wafer and the contact members are maintained in constant good electrically conducting and heat dissipating contact with the support member.

References Cited by the Examiner

UNITED STATES PATENTS

| | | | |
|---|---|---|---|
| 3,025,435 | 3/1962 | Green | 174—52 |
| 3,047,781 | 7/1962 | Eannarino | 317—234 |

JOHN W. HUCKERT, *Primary Examiner.*

GEORGE WESTBY, *Examiner.*

L. ZALMAN, *Assistant Examiner.*